United States Patent
Pazhayaveetil et al.

(10) Patent No.: US 9,768,689 B1
(45) Date of Patent: Sep. 19, 2017

(54) CONTROLLER FOR IMPOSING CURRENT LIMITS ON A BOOST CONVERTER FOR MANAGING THERMAL LOADS

(71) Applicant: Cirrus Logic, Inc., Austin, TX (US)

(72) Inventors: Ullas Pazhayaveetil, Cedar Park, TX (US); Jeffrey May, Dripping Springs, TX (US); Gautham D. Kamath, Austin, TX (US); Michael Kost, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/183,096

(22) Filed: Feb. 18, 2014

Related U.S. Application Data

(60) Provisional application No. 61/858,939, filed on Jul. 26, 2013.

(51) Int. Cl.
*H02M 3/158* (2006.01)
*H02M 3/156* (2006.01)

(52) U.S. Cl.
CPC .................................. *H02M 3/158* (2013.01)

(58) Field of Classification Search
USPC ........ 330/297, 279, 127, 129, 134; 323/282; 363/131
See application file for complete search history.

(56) References Cited

U.S. PATENT DOCUMENTS

| | | | |
|---|---|---|---|
| 7,265,530 B1 | 9/2007 | Broach et al. | |
| 7,425,819 B2 | 9/2008 | Isobe | |
| 7,737,668 B2 | 6/2010 | Oswald et al. | |
| 7,898,825 B2 | 3/2011 | Mulligan et al. | |
| 8,525,502 B2* | 9/2013 | Weinstein | H02M 1/44 323/271 |
| 2009/0010035 A1* | 1/2009 | Williams | 363/131 |
| 2014/0125303 A1* | 5/2014 | Dagan et al. | 323/282 |
| 2014/0347027 A1* | 11/2014 | Jayaraj et al. | 323/282 |

OTHER PUBLICATIONS

International Search Report and Written Opinion mailed Nov. 21, 2014, during examination of PCT/US2014/047624.

* cited by examiner

*Primary Examiner* — Hieu Nguyen
(74) *Attorney, Agent, or Firm* — Norton Rose Fulbright US LLP

(57) ABSTRACT

Thermal levels in an inductor of a boost converter may be managed by implementing peak current limits for the boost converter. For example, an inductor may be allowed to conduct above a certain peak current limit for a certain period of time before the current is reduced by a controller to a low current limit. The controller may hold the low current limit in place for a certain period of time, after which the current through the inductor is allowed to again exceed the low current limit. However, if the high current limit is again exceeded or sustained for a certain period of time, the low current limit may be again imposed by the controller.

17 Claims, 4 Drawing Sheets

CONTROLLER FOR IMPOSING CURRENT LIMITS ON A BOOST CONVERTER FOR MANAGING THERMAL LOADS

This application claims benefit of priority to U.S. Provisional Patent No. 61/858,939 to Ullas Pazhayaveetil et al. filed on Jul. 26, 2013 and entitled "Methods and Apparatuses for Digitally Regulated Peak Current Mode Controlled Boost Converter with Dynamic Level Adjustment," which is hereby incorporated by reference.

FIELD OF THE DISCLOSURE

The instant disclosure relates to an audio amplifier. In particular, the instant disclosure relates to power converters for audio amplifiers.

BACKGROUND

Portable devices are becoming more common in every aspect of our lives and affect how we interact with our music. For example, many consumers listen to their music from portable audio players, such as MP3 players or their cellular phones. These portable devices become easier and more enjoyable to use when the portable devices shrink in size while offering the same capabilities and when the portable devices can last longer from a single battery charge. To support longer lasting devices, the operating voltage of the components inside the portable device is often reduced to reduce power consumption by these components. However, a reduction in operating voltage affects the sound output of the portable device because the volume level of an audio signal output to a speaker is proportional to the output voltage. Thus, boost converters have been used to increase operating voltages for select components within a portable device that benefit from higher voltages, such as the audio amplifier that needs high voltages to generate high volumes.

FIG. 1 is a conventional audio amplifier with a boost converter. An audio amplifier 100 for a mobile device includes a battery supply 102 that provides a voltage, $V_p$, to a boost converter 104. The boost converter 104 increases the voltage $V_p$ to a boost voltage, $V_{bst}$. A speaker amplifier 108 receives the boost voltage, $V_{bst}$, and an analog audio signal, sig, from a digital-to-analog converter (DAC) 106. The speaker amplifier 108 increases the low power signal of the audio signal, sig, with power received from the boost converter 104 to generate a signal to drive a speaker 110. The boost voltage, $V_{bst}$, is higher than the supply voltage, $V_p$, which allows the speaker amplifier 108 to provide louder volume ranges through the speaker 110 than possible with only the supply voltage, $V_p$.

However, providing the boost voltage, $V_{bst}$, to the speaker amplifier 108 has drawbacks, such as increased power consumption. That is, because the speaker amplifier 108 is receiving the boost voltage, $V_{bst}$, even if volume levels are low, then the speaker amplifier 108 is wasting power. This wasted power shortens the operating time of a portable device between charges and hurts the user's experience with the portable device. Additional inefficiencies exist, such as undesirable power consumption and transients that occur when the speaker 110 is connected and disconnected from the speaker amplifier 108 while the amplifier 108 is receiving the boosted voltage, $V_{bst}$. Further, the increased power consumption by the speaker amplifier 108 may cause thermal management problems. Particularly as portable devices shrink in size and have less space for heat dissipation, the speaker amplifier 108 may be constrained in volume ranges it can provide by heat buildup in the speaker amplifier 108 or the boost converter 104. Each of these shortcomings is due to the static nature of the boost voltage, $V_{bst}$, provided to the speaker amplifier 108.

Shortcomings mentioned here are only representative and are included simply to highlight that a need exists for improved audio amplifiers, particularly for consumer-level devices. Embodiments described here address certain shortcomings but not necessarily each and every one described here or known in the art.

SUMMARY

A controller may be implemented in a boost converter to allow dynamic control over the boost converter. In particular, the controller may monitor conditions within the boost converter and execute algorithms and methods to obtain particular results in the boost converter. For example, the controller may determine inductance values for an inductor of the boost converter and measure current levels within the boost converter. The values may be used in whole or in part to manage thermal loads within the boost converter.

Thermal levels in an inductor of a boost converter may be managed by implementing peak current restrictions for the boost converter. For example, an inductor may be allowed to conduct above a certain peak current limit for a certain period of time before the current is reduced by a controller to a low current limit. The controller may hold the low current limit in place for a certain period of time, after which the current through the inductor is allowed to again exceed the low current limit. However, if the high current limit is again exceeded or sustained for a certain period of time, the low current limit may be again imposed by the controller to restrict current flow through the inductor.

Additionally, thermal levels in the inductor may be managed by controlling an average current through the inductor. For example, a switching frequency of the boost converter between charging and discharging the inductor may be increased or decreased. Increasing or decreasing the switching frequency results in a corresponding decrease or increase in the switching period for the boost converter. The controller may adjust the switching frequency to control the average current level while maintaining a peak-to-peak current level in the inductor by monitoring the inductance of the inductor and the peak current level in the inductor.

In one embodiment, a method may include determining when a current through an inductor of a boost converter exceeds approximately a high current limit for a first time period to generate a trigger to limit the current through the inductor; restricting the current to a low current limit for a second time period immediately after the first time period after the trigger is generated; and/or stopping the restricting the current to the low current limit after the second time period.

In some embodiments, the method may also include ramping the current to the low current limit from the high current limit after determining the current exceeded the high current limit for the first time period.

In certain embodiments, the step of restricting the current to a low current limit includes adjusting a switching frequency of the boost converter to limit current through the inductor; the step of ramping includes ramping at least at a rate approximately equal to a difference in the high current limit and the low current limit divided by a ramp time period; the step of determining includes determining the inductor exceeds a thermal limit; and/or the step of restricting includes reducing heat dissipated by the inductor.

In another embodiment, an apparatus may include a boost converter having an inductor; and a controller coupled to the boost converter. The controller may be configured to determine when a current through an inductor of a boost converter exceeds approximately a high current limit for a first time period; and/or restrict the current to a low current limit for a second time period after determining the first time period was reached.

In certain embodiments, the controller may be configured to eliminate the low current limit after the second time period; to ramp the current through the inductor to the low current limit after determining the current exceeded the high current limit for the first time period; to ramp the current at at least a rate approximately equal to a difference between the high current limit and the low current limit divided by a ramp time period; to determine the inductor exceeds a thermal limit; and/or to restrict the current through the inductor to reduce heat dissipated by the inductor.

In yet another embodiment, an integrated circuit may include an audio output node configured to drive a load with an amplified audio signal; an audio amplifier coupled to the audio output node and configured to generate the amplified audio signal; a boost converter coupled to the audio amplifier and configured to provide a boost voltage to the audio amplifier; and/or a boost converter controller coupled to the boost converter. The boost converter may include an inductor; a current monitoring circuit coupled to the inductor and configured to measure a current through the inductor; and a current analog-to-digital converter (ADC) coupled to the current monitoring circuit. The boost converter controller may be configured to determine when the current through the inductor of the boost converter exceeds approximately a high current limit for a first time period; and/or restrict the current to a low current limit for a second time period after determining the first time period was reached.

In certain embodiments, the boost converter controller may be further configured to eliminate the low current limit after the second time period; the boost converter controller may be further configured to ramp the current through the inductor to the low current limit after determining the current exceeded the high current limit for the first time period; the boost converter controller may be configured to determine the inductor exceeds a thermal limit; and/or the boost converter controller may be configured to restrict the current through the inductor to reduce heat dissipated by the inductor.

In one embodiment, a method may include determining a peak current value through an inductor of a boost converter; determining an inductance value of the inductor of the boost converter; and/or adjusting a frequency for switching the inductor between charging and discharging based, at least in part, on the determined peak current value and the determined inductance value.

In some embodiments, the method may also include determining an average current value through the inductor based, at least in part, on the determined peak current value and the determined inductance value; enabling a first switch to charge the inductor of the boost converter for a first time period; and/or enabling a second switch to discharge the inductor into a capacitor of the boost converter for a second time period.

In certain embodiments, the step of adjusting the switching frequency includes limiting the average current to reduce a thermal load of the inductor; the step of adjusting the switching frequency includes adjusting the switching frequency to maintain approximately a constant peak-to-peak current through the inductor; the step of determining the inductance value includes measuring a first current through the inductor at a first time; the step of determining the inductance value includes measuring a second current through the inductor at a second time; the step of determining the inductance value includes determining the inductance value based on a change from the first current to the second current over the time period from the first time to the second time; the step of determining the peak current value includes mirroring the current in a transistor coupled to the inductor; and/or the step of determining the peak current value includes reading the mirrored current with an analog-to-digital converter (ADC).

In another embodiment, an apparatus may include a boost converter having an inductor and a controller coupled to the boost converter. The controller may be configured to determine a peak current value through the inductor of the boost converter; to determine an inductance value of the inductor of the boost converter; and/or to adjust a frequency for switching the inductor between charging and discharging based, at least in part, on the determined peak current value and the determined inductance value.

In some embodiments, the boost converter may include a current monitoring circuit coupled to the inductor, in which the current monitoring circuit is configured to mirror the current through the inductor in a transistor; and/or an analog-to-digital converter (ADC) coupled to the current monitoring circuit. The controller may be configured to read the mirrored current with an analog-to-digital converter (ADC) to determine the peak current value.

In certain embodiments, the controller may be further configured to determine an average current based, at least in part, on the determined peak current value and the determined inductance value; the controller may be configured to restrict the average current to reduce a thermal load of the inductor; the controller may be configured to enable a first switch to charge the inductor of the boost converter for a first time period; the controller may be configured to enable a second switch to discharge the inductor into a capacitor of the boost converter for a second time period; the controller may be configured to adjust the switching frequency to maintain approximately a constant peak-to-peak current through the inductor; the controller may be configured to measure a first current through the inductor at a first time; the controller may be configured to measure a second current through the inductor at a second time; and/or the controller may be configured to determine the inductance value based on a change from the first current to the second current over the time period from the first time to the second time.

In a further embodiment, an integrated circuit may include an audio output node configured to drive a load with an amplified audio signal; an audio amplifier coupled to the audio output node and configured to generate the amplified audio signal; a boost converter coupled to the audio amplifier and configured to provide a boost voltage to the audio amplifier; and/or a boost converter controller coupled to the boost converter. The boost converter may include an inductor; a current monitoring circuit coupled to the inductor and configured to measure a current through the inductor; and/or a current analog-to-digital converter (ADC) coupled to the current monitoring circuit. The controller may be configured to determine a peak current value through an inductor of a boost converter; to determine an inductance value of the inductor of the boost converter; and/or to adjust a frequency for switching the inductor between charging and discharging based, at least in part, on the determined peak current value and the determined inductance value.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
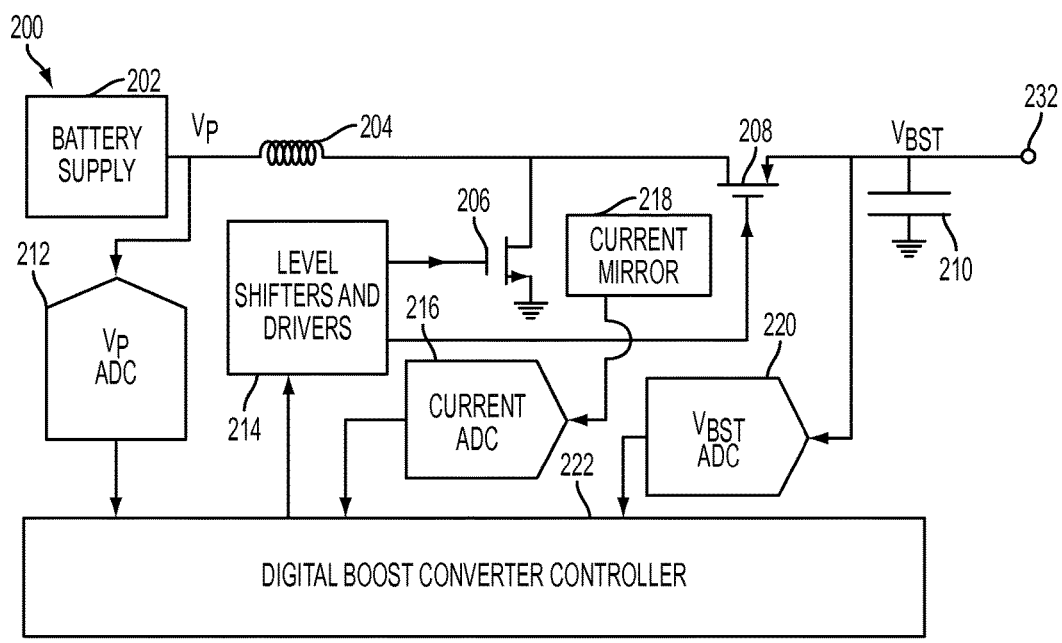
FIG. 2 is a block diagram of an audio amplifier with a dynamically-controlled boost converter according to one embodiment of the disclosure.

FIG. 2 is a block diagram of an audio amplifier with a dynamically-controlled boost converter according to one embodiment of the disclosure. A circuit 200 may include a battery supply 202, which provides a voltage, $V_p$, to the circuit 200. The circuit 200 may also include an inductor 204, with an inductance value, $L_{boost}$, coupled to an n-channel field effect transistor (NFET) 206, a p-channel field effect transistor (PMOS) 208, and a capacitor 210, having a capacitance value $C_{boost}$.

The configuration of the components 204, 206, 208, and 210 allow a digital boost converter controller 222 to generate a boost voltage, $V_{bst}$, higher than the supply voltage, $V_p$.

For example, during a first time period the NFET 206 may be switched on to a conducting state to couple the inductor 204 with ground, while the PFET 208 is switched off to a non-conducting state. This causes the supply voltage, $V_p$, to be placed across the inductor 204, current to flow through the inductor 204, and energy to be stored in the inductor 204. Then, during a second time period the NFET 206 may be switched off to a non-conducting state while the PFET 208 is switched on to a conducting state. This causes the inductor 204 to couple to ground through the capacitor 210. Thus, energy stored in the inductor 204 is transferred to the capacitor 210. As energy is stored in the capacitor 210, the voltage across the capacitor 210 increases and allows the boost voltage, $V_{bst}$, at output node 232 to increase beyond the supply voltage, $V_p$. An audio amplifier (not shown) may be coupled to the output node 232 to receive the boosted voltage, $V_{bst}$. The controller 222 may control operation of the NFET 206 and the PFET 208 to control a duration of the first time period and the second time period, which regulates the transfer of power from the inductor 204 to the capacitor 210 and thus regulates the level of the boost voltage, $V_{bst}$.

The controller 222 may receive one or more inputs that provide information to allow the controller 222 to control operation of the circuit 200. For example, the controller 222 may be coupled to an analog-to-digital converter (ADC) 212 that provides the controller 222 with information about the voltage level of the supply voltage, $V_p$. In another example, the controller 222 may be coupled to an analog-to-digital converter (ADC) 216 that provides the controller 222 with information about a current level through the inductor 204. The ADC 216 may determine the current through the inductor 204 through a current mirror 218 coupled to the NFET 206. In yet another example, an analog-to-digital converter (ADC) 220 may be coupled to the controller 222 to provide information about the boost voltage, $V_{bst}$, level.

Figure 1:
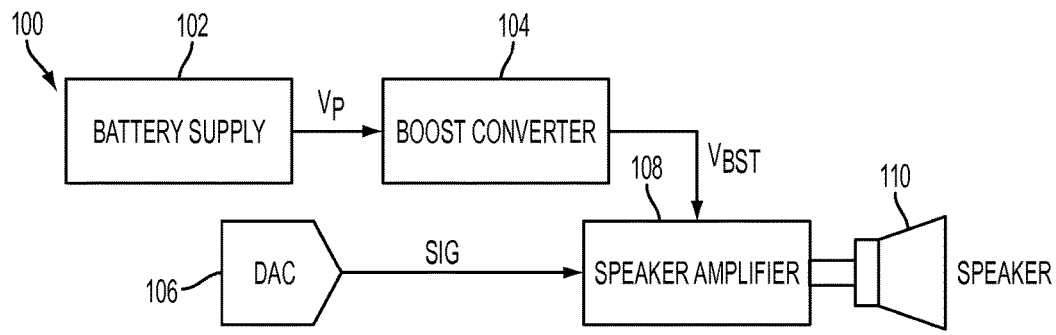
FIG. 1 is a conventional audio amplifier with a boost converter.

The circuit 200 may allow the controller 222 to control the boost converter through various inputs to the controller 222 and logic implemented in the controller 222. In comparison, the conventional audio amplifier with boost converter of FIG. 1 described above provides only a static boost voltage to the speaker amplifier, which leads to low efficiency and poor response to changing conditions. In one embodiment, the controller 222 may estimate an inductance value, $L_{boost}$, for the inductor 204 to monitor operating conditions of the inductor 204 and control the boost converter in the event of changes to the inductor 204.

The inductance value, $L_{boost}$, of inductor 204 may vary with the value of current, $I_{boost}$, passing through the inductor 204. Additionally, energy-storage characteristics of the inductor 204 change when the inductor 204 approaches or operates near or in saturation. In one embodiment, the controller 222 may measure inductor current through the current mirror 218 and the current analog-to-digital converter (ADC) 216. The current mirror 218 mirrors a current through the NFET 206, which is the current through the inductor 204. The ADC 216 then converts the analog value of current through the inductor 204 to a digital value for processing by the controller 222. The controller 222 may then determine a duration of a first time period for building current in the inductor 204 and duration of a second time period for discharging current to the capacitor 210 based on the known current in the inductor 204.

Figure 3:
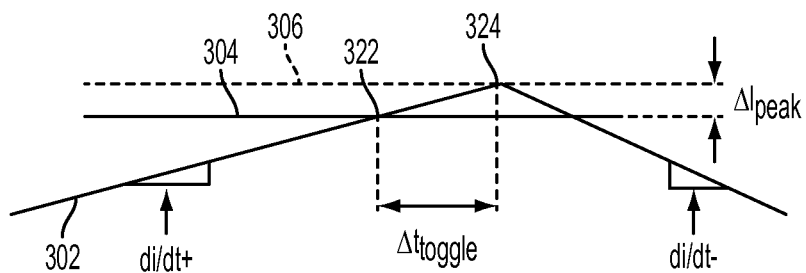
FIG. 3 is a graph illustrating estimation of an inductance value in a boost converter according to one embodiment of the disclosure.

FIG. 3 is a graph illustrating estimation of an inductance value in a boost converter according to one embodiment of the disclosure. The controller 222 may determine the transition time from the first time period to the second time period when the NFET 206 turns off and the PFET 208 turns on based on when the measured current, $I_{boost}$, shown as line 302 crosses either a slope-compensated signal or a fixed upper limit shown as line 304. After the controller 222 decides to toggle the NFET 206 and the PFET 208, control signals from the controller 222 propagate through the level shifters and drivers 214 before driving the gates of the NFET 206 and PFET 208. During this propagation delay, $\Delta t_{toggle}$, the inductor current, $I_{boost}$, continues to rise, which causes an error in the peak-current, $\Delta I_{peak}$, detected by the current mirror 218. This error value may be computed as a difference between the inductor current, shown in line 302, at the time of the control signal generation, indicated as cross point 322 and the actual value of the inductor current when the NFET 206 and the PFET 208 actually switch at point 324.

The up-slope of the inductor current of line 302 may be defined by $$\frac{di^+}{dt} = K_{CM} * \frac{V_p}{L_{boost}},$$

and a down-slope of the inductor current of line 302 may be defined by $$\frac{di^-}{dt} = K_{CM} * \frac{V_{bst} - V_p}{L_{boost}},$$

where $L_{boost}$ is the inductance value, and $K_{CM}$ is the gain value of the current measurement path including the current mirror 218. The lines 302 and 304 cross at point 322 at time $t_1$ at a current value $P_1$. After the propagation delay ($\Delta t_{toggle}$), the inductor current stops rising at time $t_2$ at a current value $P_2$. The error in the actual peak value of the inductor current is $\Delta I_{peak}$. When calculated from the up-slope of line 302, $\Delta I_{peak}$ may be calculated as $$\Delta I_{peak} = \left(K_{CM} * \frac{V_p}{L_{BOOST}}\right) * \Delta t_{toggle}.$$

Because $\Delta t_{toggle}$ is relatively constant, $V_P$ is measured and provided to the controller 222 through the analog-to-digital converter (ADC) 212, and $K_{CM}$ is known, $\Delta I_{peak}$ is directly affected by the value of $L_{boost}$. The error injected by $\Delta I_{peak}$ may be calculated and calibrated out if the value of $L_{boost}$ is known. In one embodiment, an amount of slope-compensation of line 304 for stability may be calculated as approximately at least half the down-slope of the line 302, given by $$\text{Slope Compensation} = 0.5 * \frac{di}{dt} = 0.5 * K_{CM} * \frac{V_{BST} - V_P}{L_{BOOST}},$$

where $V_P$ and $V_{bst}$ are measured and provided to the controller 222, and $K_{CM}$ is known. If $L_{boost}$ varies, a variation in the slope compensation may occur, which could lead to insufficient slope compensation and instability due to, for example, sub-harmonic oscillation. However, the $L_{boost}$ value may be determined by the controller 222 and used to improve the slope-compensation. Without an $L_{boost}$ value, a worst-case slope compensation value may be used that is not optimal for many operating conditions. Additionally, if the controller 222 recognizes that the value of $L_{boost}$ is decreasing, the controller 222 may adjust slope-compensation to counter the effect of an increased slope-compensation requirement.

Changes in $L_{boost}$ with changing inductor current may thus be compensated for by calculating the $L_{boost}$ value, knowing a starting value of $L_{boost}$, calibrating its effect out initially, and then comparing a slope of the line 302 with a calculated value of the slope. Thus, changes in $L_{boost}$, such as due to variations in current and operation at or near saturation, may be compensated.

In one embodiment, an inductance $L_{boost}$ estimator may be integrated with the controller 222, to improve slope-compensation calculation, which may improve system stability, and to accurately determine peak current, which may improve absolute current accuracy and may prevent the inductor 204 from operating in saturation.

An initial calibration may be performed to determine when calculated inductance values, $L_{boost}$, change. First, a known value of current may be forced through the inductor 204 and through the NFET 206, and thus through the current mirror 218. This known value of current may be used by the controller 222 to calibrate the current ADC 216 and the current mirror 218. Then, the boost converter may be operated with no load while samples of the current ADC 216 are taken by the controller 222 to establish a baseline inductance value from $$L_{BOOST} = VP \bigg/ \left(\frac{di}{dt}\right),$$

where di is the difference between the current ADC 216 samples, and dt is the sampling period of the ADC 216. An initial $\Delta I_{peak}$ and slope compensation value may be calculated from these initial measurements and stored by the controller 222. During normal operation, this baseline $L_{boost}$ value may be repeatedly compared with newly-calculated values of $L_{boost}$. A change between the current value of $L_{boost}$ and the initial value of $L_{boost}$ may cause the controller 222 to update $\Delta I_{peak}$ and the slope compensation values as described in the calculations above.

During saturation, the earlier $\Delta I_{peak}$ equation may not be valid because the inductor waveform may depart from its expected saw-tooth signature for a peaking waveform that is non-linear at the tips. According to some embodiments, the controller 222 may be able to detect when saturation occurs and prevent saturation by reducing the current load, and consequently the current draw, thereby bringing the inductor 204 out of saturation and back into linear operation.

Figure 4:
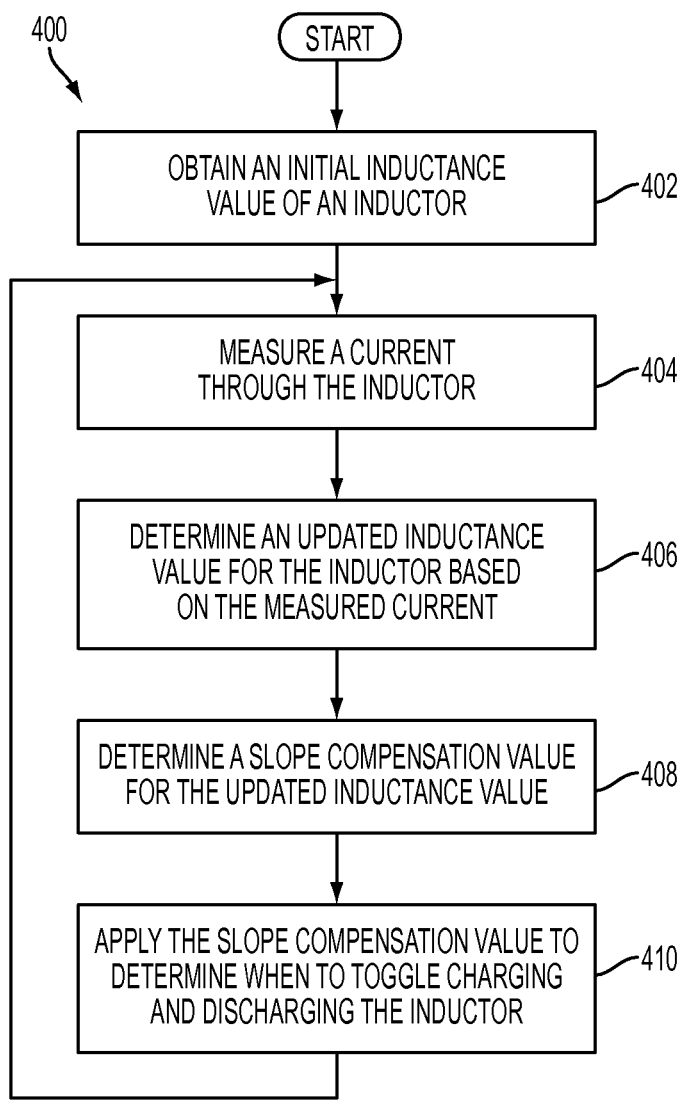
FIG. 4 is a flow chart illustrating a method of estimating an inductance value and modifying boost converter operation in response to changes in inductance value according to one embodiment of the disclosure.

FIG. 4 is a flow chart illustrating a method of estimating an inductance value and modifying boost converter operation in response to changes in inductance value according to one embodiment of the disclosure. A method 400 may begin at block 402 with obtaining an initial inductance value of an inductor of a boost converter. Block 402 may be performed, for example, during a start-up procedure before audio is output from an audio amplifier. At block 404, a current through the inductor is measured by the controller during operation of the boost converter, such as while the boost converter and audio amplifier are amplifying an audio signal.

At block 406, an updated inductance value for the inductor of the boost converter may be determined by the controller based on the measured current of block 404. The updated inductance value may indicate changes in the inductance value that are caused by, for example, operation at or near saturation or other conditions. At block 408, when the updated inductance value of block 404 differs from the initial inductance value of block 402, an updated slope compensation value may be calculated for the updated inductance value of block 406. The updated slope compensation value may be calculated from $$\text{Slope Compensation} = 0.5 * \frac{di}{dt} = 0.5 * K_{CM} * \frac{V_{BST} - V_P}{L_{BOOST}},$$

wherein $K_{CM}$ is a gain value, $V_{bst}$ is the boost voltage, $V_P$ is a supply voltage, and $L_{boost}$ is the inductance value of the inductor.

The updated slope compensation value of block 408 may be applied, at block 410, to determine when to toggle charging and discharging of the inductor. For example, the controller may calculate an approximate time the current through the inductor will reach a peak current level by calculating a toggle delay in toggling the NFET and PFET of the boost converter. The controller may then toggle the NFET and PFET in advance of the time the inductor would reaches the peak current level, taking into account the toggle delay, to reduce damage to the inductor and undesirable effects output by the audio amplifier when saturation is reached. The method 400 executing in the controller may return to block 404 to repeatedly, continuously, periodically, or occasionally measure a current through the inductor and update the calculated inductance value at block 406 and slope compensation value at block 408.

As described above, an initial calibration and storage of the inductance, $L_{boost}$, in conjunction with periodic or occasional re-evaluation of the inductance value, $L_{boost}$, by using, for example, the measured supply voltage, $V_P$, by the ADC 212 and the measured boost current by the ADC 216 allows the controller 222 to monitor changes in the inductance value, $L_{boost}$. A sudden drop in this value, such as approximately a 30 to 80% change, may be indicative of reaching saturation or sudden inductor current spiking, which may cause damage to the inductor 204 and/or the boost converter. This information may be used by the controller 222 to control the audio amplifier and/or the boost converter to reduce the load and prevent damage to both the inductor and the boost converter. Additionally, the controller 222 may dynamically adjust slope compensation to better stabilize the system, as well as increasing the accuracy of detected peak inductor current levels. For example, slope compensation may be adjusted between approximately −70 and +80 percent during a span of approximately 3-10 microseconds.

Referring back to FIG. 2, the inductor current information measured by the controller 222 through the current ADC 216 and the current mirror 218 may be used to determine when thermal loading on the inductor 204 are at or near thermal limit. A thermal limit for the inductor 204 may be established to protect the inductor 204 from reaching saturation and/or to artificially limit the amount of power that may be consumed by the audio amplifier and/or the boost converter. Because the mechanism of failure in systems with power devices such as a boost converter or audio amplifier is usually thermal-related, feedback mechanisms and monitoring systems may be implemented in the controller 222 and a pseudo-thermal limit, which may be a current limit that approximately simulates a certain thermal load, set for the inductor 204.

In one embodiment, when a current limit is set for the inductor 204, the controller 222 may monitor the current through the inductor 204 an determine if the current through the inductor 204 reaches the current limit for a pre-defined duration of time. For example, the controller 222 may be programmed with a high current limit of 2 Amps and a pre-defined duration of time of 2 second. When the current through the inductor 204, measured by the ADC 216 and provided to the controller 222, reaches 2 Amps and remains at or above 2 Amps for 2 seconds, the controller 222 may generate a trigger event. Although the high current limit is described as a limit, the high current limit may only be a trigger level rather than an actual limit. That is, the controller may not limit the current through the inductor to the high current limit. Instead, the controller may only determine when the current meets or exceeds the high current limit, regardless of how much the current exceeds the high current limit.

When the trigger event occurs, the controller 222 may reduce the current limit for the inductor 204 to a low current limit. For example, when the high current limit is 2 Amps the low current limit may be 1.5 Amps. In one embodiment, the current may be limited by toggling the NFET 206 and the PFET 208 through the level shifters and drivers 214. For example, duty-cycling may be applied to disconnect the inductor 204 from the ground and the capacitor 210 by turning off both the NFET 206 and the PFET 208 for a portion of time.

The low current limit may be held for a pre-determined period of time, after which the low current limit may be disabled and the high current limit reinstated. Holding the current to the low current limit for a duration of time reduces heat dissipated by the inductor 204 and thus allows the temperature of the inductor 204 to decrease.

Figure 5:
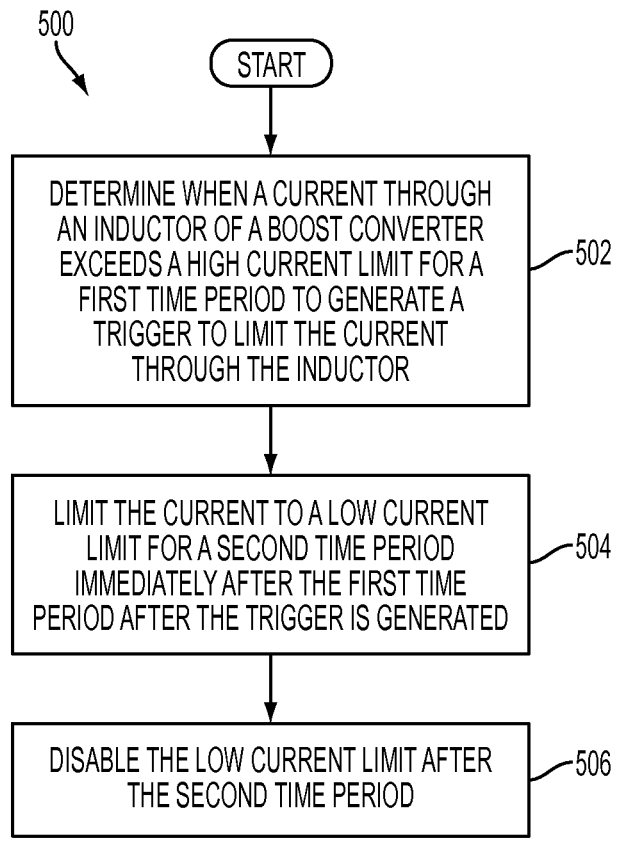
FIG. 5 is a flow chart illustrating a method of implementing current limits in an inverter of a boost converter according to one embodiment of the disclosure.

FIG. 5 is a flow chart illustrating a method of implementing current limits in an inverter of a boost converter according to one embodiment of the disclosure. A method 500 may begin at block 502 with determining when a current through an inductor of a boost converter exceeds a high current limit for a first time period to generate a trigger to limit the current through the inductor. Then, at block 504 when the trigger is generated, the current through the inductor may be restricted to a low current limit for a second time period immediately after the first time period. Finally, at block 506, after the second time period ends, the low current limit may be disabled and the current through the inductor allowed to return to the high current limit. The method 500 may repeat, such that if the current through the inductor does return to the high current limit and maintained for the first time period, then the method 500 proceeds again to block 504 and block 506.

Figure 6:
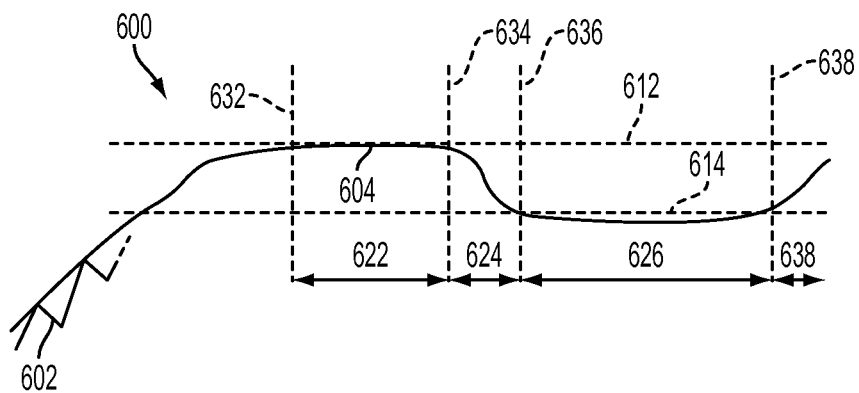
FIG. 6 is a graph illustrating current through an inductor with a high current limit and a low current limit according to one embodiment of the disclosure.

The high current limit and low current limit of FIG. 5 are illustrated in FIG. 6. FIG. 6 is a graph illustrating current through an inductor with a high current limit and a low current limit according to one embodiment of the disclosure. A graph 600 includes a line 602 showing an inductor current waveform and a line 604 showing an envelope around peaks in the current waveform 602. A low current limit is shown as line 614, and a high current limit is shown as line 612. The current of line 604 is allowed to increase until it reaches the high current limit of line 612 at time 632, at which time a timer is started. The timer continues to run until the current of line 604 falls below the high current limit of line 612, at which time the timer is reset, or until the timer reaches a first time period 622.

At time 634, after the first time period 622 has elapsed, a trigger event is generated within the controller to trigger thermal protection for the inductor. During a transition time period 624, the current of line 604 is reduced from the high current limit of line 612 to the low current limit of line 614. A time duration may be specified for the transition time period 624 to determine a rate of reduction for the current of line 604. For example, a minimum rate of reduction may be calculated by $$\text{ramp rate} = \frac{\text{High Current Limit} - \text{Low Current Limit}}{\text{Transition Time Period}}.$$

The current is then restricted to the low current limit of line 614 for a second time period 626. After the second time period 626, the current of line 604 may be allowed to return to the high current limit in time period 628.

By selecting a high current limit and a low current limit, peak bursts of audio energy may be allowed to be amplified with a boost convert without restricting the boost converter's output. For example, momentary loud portions of an audio signal may be allowed within the high current limit. Thus, better performance may be obtained from the boost converter by allowing temporary high currents through the inductor, while still protecting the inductor from saturation by preventing the high current from lasting for a long duration of time. Incorporating a controller within the boost converter allows the monitoring of current within the boost converter and control of the boost converter based on this monitored current level.

Figure 7:
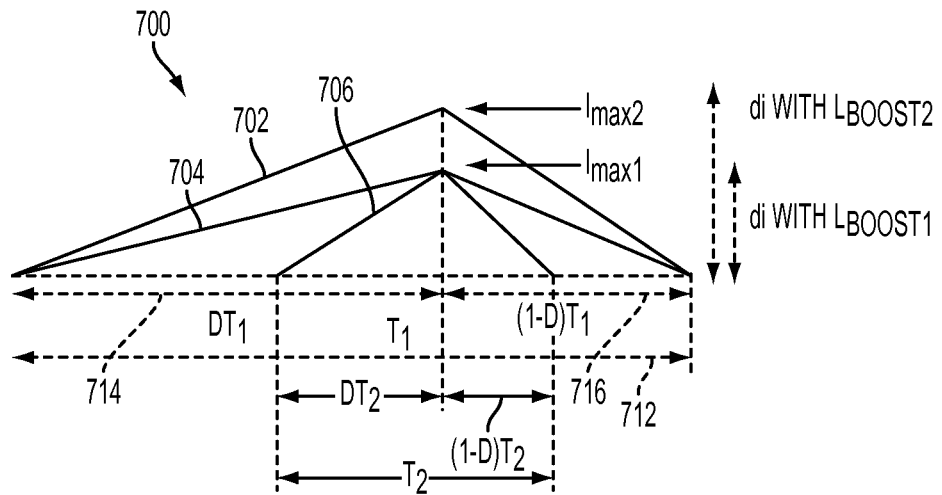
FIG. 7 is a graph illustrating the effect of switching frequency and inductance value on peak current through an inductor of a boost converter according to one embodiment of the disclosure.

In another embodiment, the current through the inductor may restricted to the low current limit by changing a switching frequency of the boost converter. FIG. 7 is a graph illustrating the effect of switching frequency and inductance value on peak current through an inductor of a boost converter according to one embodiment of the disclosure. A graph 700 includes a line 702 showing current through an inductor of a boost converter having an inductance value of $L_{boost,2}$ and a line 704 showing current through an inductor having an inductance value of $L_{boost,1}$. The line 702 peaks at $I_{max,2}$, and the line 704 peaks at $I_{max,1}$. The difference between a max inductor current and an average inductor current value depends on the value of the inductor itself, which may change over time as described above. The value of the inductor current ripple, di, may be calculated as $$di = I_{max} - I_{min} = \frac{V_p * D * T}{L_{boost}} = \frac{(V_{boost} - V_p)(1-D)T}{L_{boost}},$$

and an average inductor current may be calculated as $$I_{avg} = \frac{I_{max} + I_{min}}{2} = I_{max} - \frac{di}{2},$$

where D is the duty cycle and is dependent on the desired value of $V_{bst}$ and a measured value of $V_P$, T is the switching period, and $I_{max}$ and $I_{min}$ are the maximum and minimum inductor current values for the current switching cycle.

Because the inductance value changes with inductor current, and absolute peak current of the inductor may be limited as described in FIGS. 5 and 6, different amounts of average inductor current may occur when the inductance value changes. The thermal failure mechanism described above may depend on the average value of inductor current.

Thus, the current limiting may be further improved to allow increased peak power performance by combining the current limiting with inductor monitoring described with reference to FIGS. 3 and 4 to change the switching frequency and approximately maintain the inductor ripple (di).

The inductor ripple current (di) depends on voltage values $V_P$ and $V_{bst}$, the duty cycle D, the inductance value, $L_{boost}$, and the switching period T. $V_P$ and $V_{bst}$ may be monitored, such as through the analog-to-digital converters (ADCs) 212 and 220. The duty cycle may be determined by the controller 220 based on the ratio of the desired $V_{bst}$ voltage compared to the $V_p$ voltage. By also determining the $L_{boost}$ value as shown in FIGS. 3 and 4, the switching period, T, may be changed to maintain approximately a constant ripple (di). That is, a switching frequency for the boost converter may be increased to shorten the switching period, T. This allows the controller 222 to maintain a steady difference between the periodic average current, $I_{avg}$, and peak current, $I_{max}$, allowing the use of a peak limit to better control the average current thermal limit. Referring back to FIG. 7, a line 706 shows an inductor current profile with a shortened time period, T2, resulting from a faster switching frequency, while the peak-to-peak current is maintained at $I_{max,1}$.

Figure 8:
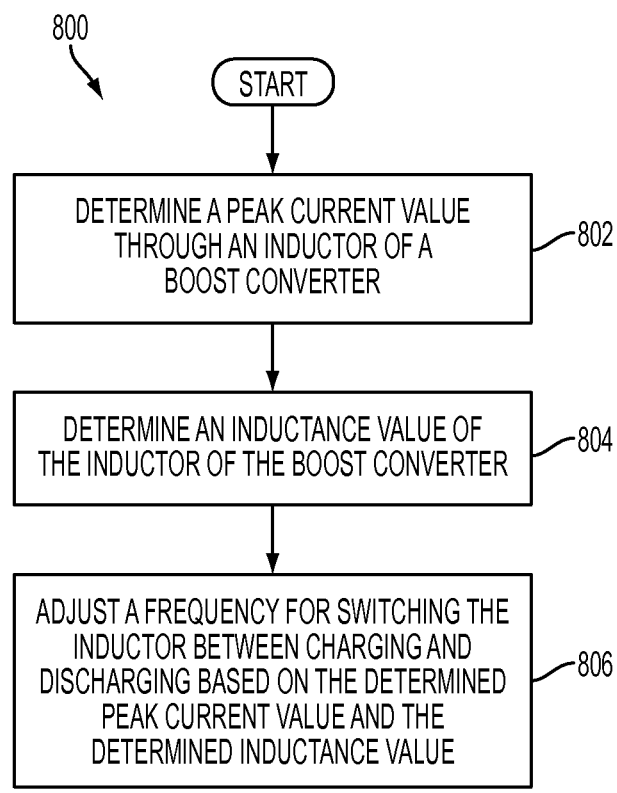
FIG. 8 is a flow chart illustrating a method of thermal management of an inductor of a boost converter by adjusting a frequency switching of the boost converter according to one embodiment of the disclosure.

FIG. 8 is a flow chart illustrating a method of thermal management of an inductor of a boost converter by adjusting a frequency switching of the boost converter according to one embodiment of the disclosure. A method 800 begins at block 802 with determining a peak current value through an inductor of a boost converter. The peak current value may be determined, for example, by mirroring current through the inductor in the current mirror 218 of FIG. 2 and reading the current mirror 218 through the analog-to-digital converter (ADC) 216.

At block 804, an inductance value of the inductor of the boost converter may be determined. The inductance value may be determined as described above with reference to FIGS. 3 and 4. For example, the inductance value may be determined by measuring a first current through the inductor at a first time, measuring a second current through the inductor at a second time, and determining the inductance based on a change from the first current to the second current over the time period from the first time to the second time.

At block 806, a switching frequency may be adjusted to change the switching of the inductor between charging and discharging based on the determined peak current value of block 802 and the determined inductance value of block 804. The switching frequency may be changed to limit an average current through the inductor to reduce a thermal load on the inductor. Further, the peak-to-peak current through the inductor, or the current ripple di, may be approximately maintained as the switching frequency is adjusted.

If implemented in firmware and/or software, the operations described above, such as with reference to FIGS. 4, 5, and 8, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   determining when a current through an inductor of a boost converter exceeds a high current limit for a first non-zero time period to generate a trigger to limit the current through the inductor, wherein the step of determining comprises steps comprising:
   starting a timer when the current through the inductor exceeds the high current limit;
   resetting the timer when the current through the inductor falls below the high current limit; and
   comparing the timer with the first non-zero time period to determine when the current through the inductor of the boost converter exceeds the high current limit for the first non-zero time period to generate the trigger to limit the current through the inductor;
   restricting the current to a low non-zero current limit lower than the high current limit for a second time period after the first time period after the trigger is generated; and
   stopping the restricting the current to the low current limit after the second time period.

2. The method of claim 1, wherein the step of restricting the current to a low current limit comprises adjusting a switching frequency of the boost converter to restrict current through the inductor.

3. The method of claim 1, further comprising ramping the current to the low current limit from the high current limit after determining the current exceeded the high current limit for the first time period.

4. The method of claim 3, wherein the step of ramping comprises ramping at least at a rate approximately equal to a difference in the high current limit and the low current limit divided by a ramp time period.

5. The method of claim 1, wherein the step of determining comprises determining the inductor exceeds a thermal limit.

6. The method of claim 1, wherein the step of restricting comprises reducing heat dissipated by the inductor.

7. An apparatus, comprising:
   a boost converter comprising an inductor; and
   a controller coupled to the boost converter, the controller configured to:
   determine when a current through the inductor of the boost converter exceeds a high current limit for a first non-zero time period, wherein the controller is configured to determine when the current exceeds the non-zero time period by performing steps comprising:
   starting a timer when the current through the inductor exceeds the high current limit;
   resetting the timer when the current through the inductor falls below the high current limit; and
   comparing the timer with the first non-zero time period to determine when the current through the inductor of the boost converter exceeds the high current limit for the first non-zero time period to generate the trigger to limit the current through the inductor; and
   restrict the current to a low non-zero current limit lower than the high current limit for a second time period after determining the high current limit was exceeded for the first time period.

8. The apparatus of claim 7, wherein the controller is further configured to eliminate the low current limit after the second time period.

9. The apparatus of claim 7, wherein the controller is further configured to ramp the current through the inductor to the low current limit after determining the current exceeded the high current limit for the first time period.

10. The apparatus of claim 9, wherein the controller is configured to ramp the current at at least a rate approximately equal to a difference between the high current limit and the low current limit divided by a ramp time period.

11. The apparatus of claim 7, wherein the controller is configured to determine if the inductor exceeds a thermal limit.

12. The apparatus of claim 7, wherein the controller is configured to restrict the current through the inductor to reduce heat dissipated by the inductor.

13. An integrated circuit, comprising:
   an audio output node configured to drive a load with an amplified audio signal;
   an audio amplifier coupled to the audio output node and configured to generate the amplified audio signal;
   a boost converter coupled to the audio amplifier and configured to provide a boost voltage to the audio amplifier, wherein the boost converter comprises:
   an inductor;
   a current monitoring circuit coupled to the inductor and configured to measure a current through the inductor; and
   a current analog-to-digital converter (ADC) coupled to the current monitoring circuit; and
   a boost converter controller coupled to the boost converter and configured to:
   determine when the current through the inductor of the boost converter exceeds approximately a high current limit for a first non-zero time period, wherein the boost converter controller is configured to perform the determining by performing steps comprising:
   starting a timer when the current through the inductor exceeds the high current limit;

resetting the timer when the current through the inductor falls below the high current limit; and comparing the time with the first non-zero time period to determine when the current through the inductor of the boost converter exceeds approximately the high current limit for the first non-zero time period to generate the trigger to limit the current through the inductor; and restrict the current to a low non-zero current limit lower than the high current limit for a second time period after determining the high current limit was exceeded for the first time period.

14. The integrated circuit of claim 13, wherein the boost converter controller is further configured to eliminate the low current limit after the second time period.

15. The integrated circuit of claim 13, wherein the boost converter controller is further configured to ramp the current through the inductor to the low current limit after determining the current exceeded the high current limit for the first time period.

16. The integrated circuit of claim 13, wherein the boost converter controller is configured to determine the inductor exceeds a thermal limit.

17. The integrated circuit of claim 13, wherein the boost converter controller is configured to restrict the current through the inductor to reduce heat dissipated by the inductor.

\* \* \* \* \*